United States Patent [19]
Leibovich et al.

[11] Patent Number: 5,958,139
[45] Date of Patent: Sep. 28, 1999

[54] PLASMA ETCH SYSTEM

[75] Inventors: Vladimir E. Leibovich, Petaluma; Martin L. Zucker, Santa Rosa, both of Calif.

[73] Assignee: Tegal Corporation, Petaluma, Calif.

[21] Appl. No.: 08/850,224

[22] Filed: May 2, 1997

Related U.S. Application Data

[62] Division of application No. 08/450,369, May 25, 1995.

[51] Int. Cl.$^6$ .................................................. C23C 16/00
[52] U.S. Cl. ...................... 118/723 R; 156/345; 118/728
[58] Field of Search ................................ 118/723 R, 728; 156/345; 204/298.15; 361/234; 279/128

[56] References Cited

U.S. PATENT DOCUMENTS

| | | |
|---|---|---|
| 4,457,359 | 7/1984 | Holden . |
| 4,508,161 | 4/1985 | Holden . |
| 4,512,391 | 4/1985 | Harra . |
| 4,535,834 | 8/1985 | Turner . |
| 4,542,298 | 9/1985 | Holden . |
| 4,612,077 | 9/1986 | Tracy et al. . |
| 4,680,061 | 7/1987 | Lamont, Jr. . |
| 4,743,570 | 5/1988 | Lamont, Jr. . |
| 4,780,169 | 10/1988 | Stark et al. ............... 156/345 |
| 4,790,258 | 12/1988 | Drage et al. ............... 118/500 |
| 4,909,314 | 3/1990 | Lamont, Jr. . |
| 5,127,988 | 7/1992 | Kawamura et al. . |
| 5,192,849 | 3/1993 | Moslehi ............... 219/121.43 |
| 5,211,796 | 5/1993 | Hansen ............... 156/345 |
| 5,221,427 | 6/1993 | Koinuma et al. . |
| 5,344,525 | 9/1994 | Cathey, Jr. . |
| 5,372,674 | 12/1994 | Steinberg . |
| 5,447,570 | 9/1995 | Schmitz et al. ............... 118/728 |
| 5,466,325 | 11/1995 | Mizuno et al. ............... 156/344 |
| 5,516,367 | 5/1996 | Lei et al. ............... 118/725 |
| 5,556,476 | 9/1996 | Lei et al. ............... 118/728 |

FOREIGN PATENT DOCUMENTS

| | | |
|---|---|---|
| 284436-A | 9/1988 | European Pat. Off. . |
| 295196-A | 10/1991 | German Dem. Rep. . |
| 61-116841 | 6/1985 | Japan . |
| 61-039520-A | 2/1986 | Japan . |
| 6-196410 | 7/1994 | Japan . |

*Primary Examiner*—Bruce Breneman
*Assistant Examiner*—Luz Alejandro
*Attorney, Agent, or Firm*—Fliesler, Dubb, Meyer & Lovejoy LLP

[57] ABSTRACT

This invention relates to a plasma reactor apparatus having improved etch uniformity and throughput. Higher etch uniformity is achieved through the use of a new gas delivery mechanism and a thermally insulated wafer chuck. The vacuum insulated chuck also results in lower energy consumption and higher throughput.

7 Claims, 2 Drawing Sheets

PLASMA ETCH SYSTEM

This application is a division of Ser. No. 08/450,369, filed May 25, 1995.

FIELD OF THE INVENTION

The present invention relates to an improved plasma reactor, more particularly, to a reactor designed to enhance etch uniformity and increase throughput.

BACKGROUND OF THE INVENTION

Plasma etching has become an important process in the fabrication of semiconductor devices in integrated circuits. A key requirement of any plasma process used in fabrication of semiconductor devices is that the devices formed must have uniform and consistent electrical characteristics across a wafer. In other words, the plasma etching process must be capable of creating highly uniform device structures with respect to thickness, dimensions and cross-sectional profiles. However, such uniformity has become increasingly difficult to obtain as wafers are increasing in diameter and device dimensions are becoming smaller. Combined with the need to lower the cost of production, plasma etch reactors must have improved uniformity and throughput.

Uniformity of device structures across a wafer is dependent upon factors such as the manner in which gas is introduced into the chamber and the temperature gradient across a wafer. In order to achieve uniform etching across a wafer, etching gas must be introduced into the plasma reactor in a uniform manner. Traditionally, this is accomplished through the use of a plurality of small inlet holes through which etching gas flows into a reaction chamber. Not only are the inlet holes difficult to machine, but also create uniformity problems on the wafer. The inlet holes introduce gas into a reaction chamber in a localized manner with the highest density of gas in areas near the holes. Since, the gas is not evenly introduced, the etch uniformity across a wafer varies significantly depending on the size and the number of inlet holes used.

Beside the gas delivery system, the amount of temperature gradient on a wafer also affects etch uniformity. Some plasma processes such as certain metal etch require wafers to be heated during the plasma process. To keep the temperature across a wafer uniform, the plasma etch system must be able to reduce the amount of heat loss or heat transfer from the wafer chuck on which the wafer sits. Typically, during plasma processing, only the top surface of a wafer chuck in a plasma reactor is under vacuum while the bottom surface of the chuck is typically at atmospheric pressure. The fact that the bottom surface of the wafer chuck is at atmospheric pressure causes heat loss through convection underneath the chuck. Not only does the convection heat loss decrease the temperature uniformity across a wafer during processing, it also reduces throughput because the heater takes longer to heat up a wafer prior to etching. Therefore, there is a need to develop a means to reduce heat loss from the bottom surface of the wafer chuck so as to increase etch uniformity and throughput.

SUMMARY OF THE INVENTION

In a broad sense, this invention provides an apparatus which produces enhanced etch uniformity and increased throughput.

This present invention discloses a new and improved apparatus for introducing an etching gas into a plasma etch system. Instead of introducing gas into the chamber through an array of small inlet holes, gas is introduced into the chamber through a continuous circular gap, which results in a uniform and continuous sheet of gas flowing into the chamber. This eliminates any localized pressure differential that adversely affects etch uniformity. The continuous circular gap provides a radially smooth gradient of gas flow causing the density of gas around the wafer to be evenly distributed resulting in high etch uniformity.

This present invention also discloses a thermally insulated heated chuck which contributes to higher etch uniformity and wafer throughput. Vacuum insulation provided to the back surface of the wafer chuck used in the present invention results in better temperature uniformity and therefore better etch uniformity across a wafer. Instead of being at atmospheric pressure, this plasma etch apparatus provides vacuum thermal insulation to the backside of the wafer chuck, which leads to better temperature and etch uniformity across the wafer. It is well-known that vacuum provides good thermal insulation since it is a poor medium for heat transfer. By introducing a soft vacuum underneath the chuck, it eliminates heat dissipation from the bottom surface of the chuck through convection. Instead, heat must be transferred by conduction along the thin wall of the vacuum housing underneath the chuck. This reduction in heat transfer also reduces the amount of energy needed to maintain the temperature of the chuck during wafer processing, thereby saving energy cost and reducing the time it takes to keep the temperature fluctuation of the chuck within needed tolerances. The reduced heat transfer also results in minimizing the time it takes to heat up the wafer before an etch, thus increasing wafer throughput.

DETAILED DESCRIPTION OF THE INVENTION AND PREFERRED EMBODIMENTS

Figure 1:
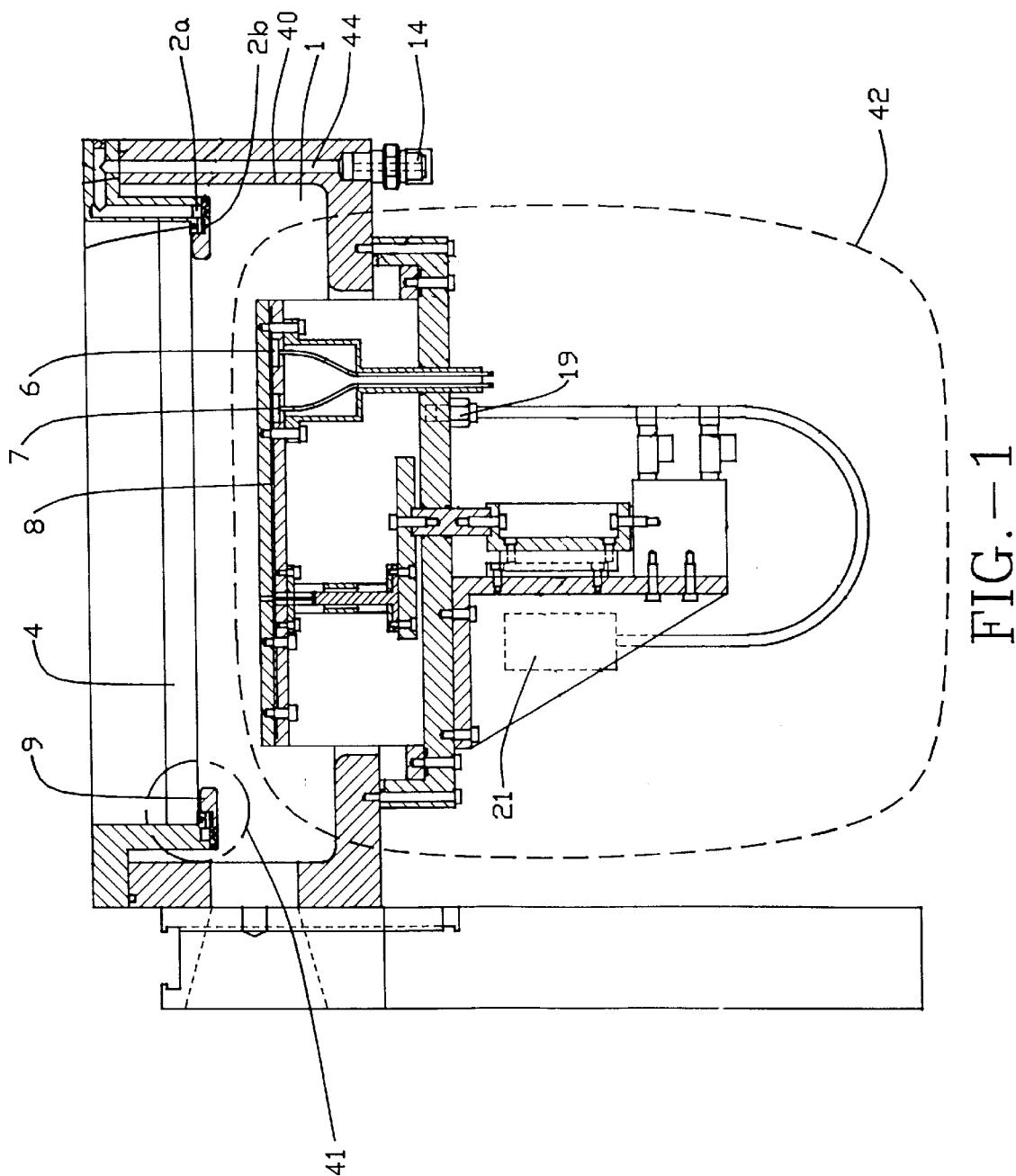
FIG. 1 illustrates in cross section an embodiment of apparatus in accordance with the invention.
Figure 2:
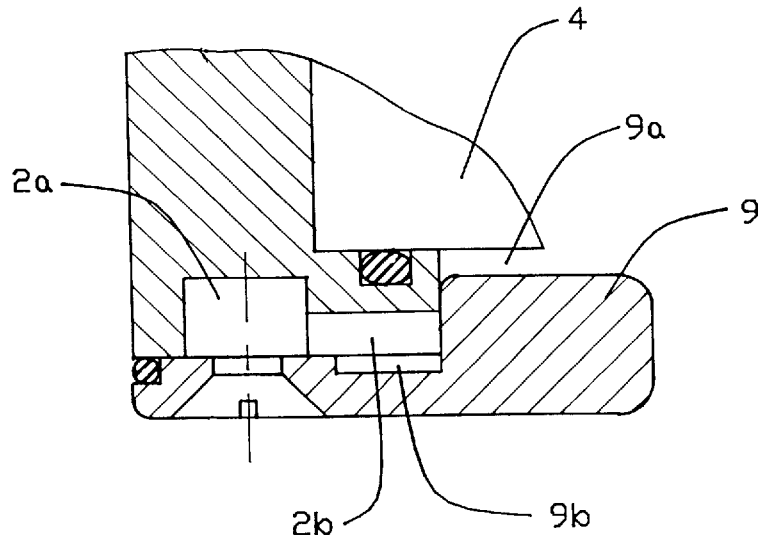
FIG. 2 illustrates in cross section an embodiment of a gas delivery apparatus in accordance with the invention.

One embodiment of apparatus in accordance with the invention is illustrated in cross section in FIG. 1. The apparatus includes a reaction chamber 1 which is formed by a top quartz window 4, a cylindrical chamber sidewall 40, and a wafer chuck and bottom plate assembly 42. Underneath and along the perimeter of the top quartz window 4 is gas delivery system 41. A gas inlet 14 provides for the ingress of reactants to the chamber. After the reactants enter the apparatus through the gas inlet 14, they flow through a U-shaped gas passage way 44 into a circular gas cavity 2a, which is part of the gas delivery apparatus illustrated in FIG. 2. In FIG. 2, gas from the circular gas cavity 2a travels through a plurality of slots 2b and enters into a circular gas plenum 9b. The gas cavity 2a and gas plenum 9b are introduced to maintain the proper pressure differential. From circular gas plenum 9b, the gas flows through a continuous circular gap 9a, which is between the top quartz window 4 and the gas flange 9, into the chamber 1. As a result, the gas is introduced into the chamber through a continuous opening between the gas flange 9 and the top quartz window 4 creating an uninterrupted "wall" of gas.

Figure 3:
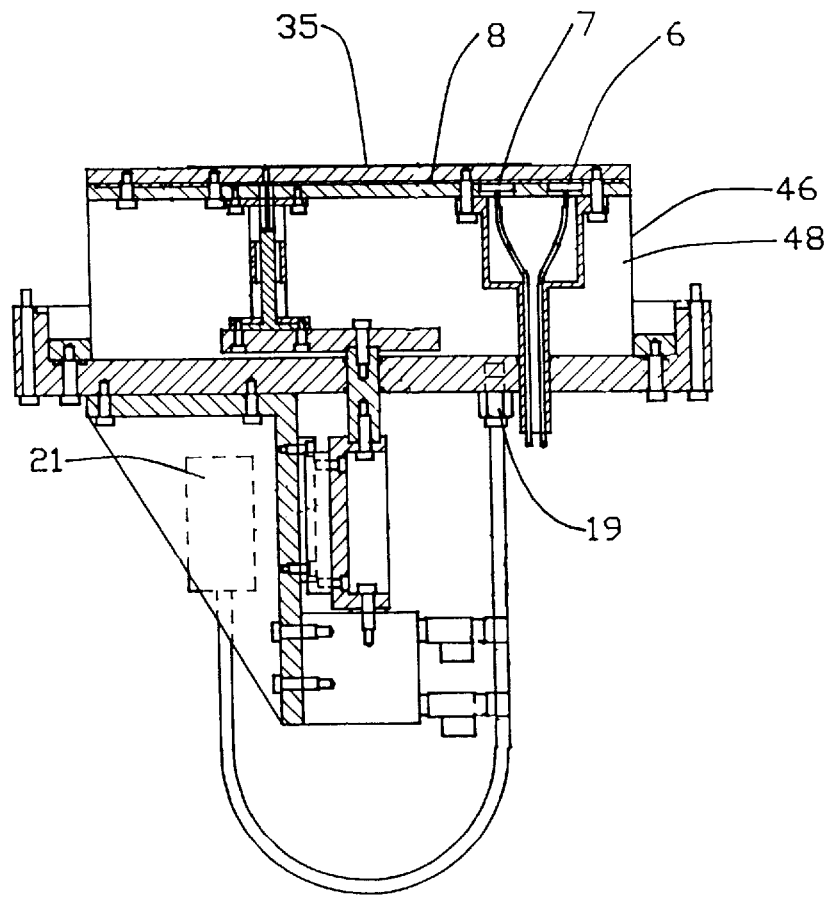
FIG. 3 illustrates in cross section an embodiment of a wafer chuck assembly in accordance with the invention.

FIG. 3 illustrates the details of wafer chuck assembly 42 for holding a wafer such as wafer 35. The wafer chuck and bottom plate assembly 42 includes a wafer chuck 6, a heating element 7, and a back plate 8. The heating element 7 is sandwiched between the wafer chuck 6 and the back plate 8. The volume 48 is evacuated through gas fitting 19 by vacuum generator 21. Since volume 48 is under vacuum, any heat transfer occurs mostly through conduction along the sidewall 46 of wafer chuck 6.

What is claimed is:

1. A plasma reactor comprising:

a plasma reaction chamber;

a chuck with a frontside and a backside, which frontside of said chuck is adapted to support a wafer to be processed;

means adapted for heating said chuck;

means adapted for generating a vacuum environment around said chuck separate from said chamber in order to thermally insulate said chuck; which generating means includes a backside chamber which is co-extensive with the backside of the chuck, said vacuum generating means including a vacuum generator for evacuating said backside chamber.

2. A plasma reactor comprising:

a plasma reaction chamber;

a chuck with a frontside adapted to support a wafer to be processed;

said chuck having a backside;

a heater that heats said chuck; and an enclosure, separate from said chamber, for creating a vacuum environment adjacent to said chuck in order to thermally insulate said chuck, wherein said enclosure is co-extensive with the backside of the chuck; and a vacuum generator connected to said enclosure, said vacuum generator for evacuating said enclosure.

3. A reactor comprising:

a reaction chamber;

a chuck with a frontside that is adapted to position a wafer to be processed;

said chuck having a backside;

an enclosure located adjacent to said chuck, said enclosure constructed in order to hold a vacuum adjacent to said chuck in order to thermally insulate said chuck; and said enclosure being co-extensive with the backside of the chuck; and a vacuum generator connected to said enclosure, said vacuum generator for evacuating said enclosure.

4. A reactor comprising:

a reactor chamber;

a device with a frontside that is adapted to position a wafer to be processed;

said device having a backside;

a backside chamber located adjacent to said backside of said device; and said backside chamber capable of holding a vacuum in order to thermally insulate said device, which said backside chamber is co-extensive with said backside of said device; and a vacuum generator connected to said backside chamber, said vacuum generator for evacuating said backside chamber.

5. The reactor of claim 4 wherein said device is a chuck.

6. The reactor of claim 5 wherein said chuck includes a chuck heater.

7. A reactor comprising:

a reactor chamber;

a device adapted to position a wafer to be processed;

said device having a backside;

a backside chamber located adjacent to said backside of said device;

said backside chamber capable of holding a vacuum in order to thermally insulate said device;

a vacuum generator connected to said backside chamber, said vacuum generator for evacuating said backside chamber;

wherein said device is a chuck; and wherein said chuck including a chuck heater.

* * * * *